United States Patent [19]
Glover et al.

[11] Patent Number: 5,978,426
[45] Date of Patent: Nov. 2, 1999

[54] PHASE LOCKED LOOP SYSTEM AND METHOD FOR USE IN A DATA CHANNEL

[75] Inventors: Kerry C. Glover, Wylie; Benjamin J. Sheahan, Dallas, both of Tex.

[73] Assignee: Texas Instruments Incorporated, Dallas, Tex.

[21] Appl. No.: 08/834,413

[22] Filed: Apr. 16, 1997

Related U.S. Application Data

[60] Provisional application No. 60/015,830, Apr. 18, 1996.

[51] Int. Cl.[6] ............................................... H03D 3/24
[52] U.S. Cl. .............................. 375/376; 360/51; 327/156
[58] Field of Search ...................... 375/375, 376; 360/46, 51; 327/155, 156

[56] References Cited

U.S. PATENT DOCUMENTS

| | | | |
|---|---|---|---|
| 5,258,877 | 11/1993 | Leake et al. | 360/51 |
| 5,341,249 | 8/1994 | Abbott et al. | 360/46 |
| 5,546,433 | 8/1996 | Tran et al. | 375/376 |
| 5,654,948 | 8/1997 | Tobita | 369/48 |
| 5,829,011 | 10/1998 | Glover | 711/100 |

OTHER PUBLICATIONS

Dean Palmer, Pablo Ziperovich, Roger Wood, and Thomas D. Howell, "Identification of Nonlinear Write Effects Using Pseudorandom Sequences," *IEEE Transactions on Magnetics*, vol. MAG–23, No. 5, Sep. 1987, pp. 2377–2379.

Roger Wood, "Jitter vs. Additive Noise in Magnetic Recording: Effects on Detection," *IEEE Transactions on Magnetic*, vol. MAG–23, No. 5, Sep. 1987, pp. 2683–2685.

H.K. Thapar and A.M. Patel, "A Class of Partial Response Systems for Increasing Storage Density in Magnetic Recording," *IEEE Transactions on Magnetics*, vol. MAG–23, No. 5, Sep. 1987, pp. 3666–3668.

Yinyi Lin and Jack K. Wolf, "Combined ECC/RLL Codes," *IEEE Transactions on Magnetics*, vol. 24, No. 6, Nov. 1988, pp. 2527–2529.

Catherine A. French, Anthony D. Weathers, and Jaek Keil Wolf, "A Generalized Scheme for Generating and Detecting Recording Channel Output Waveforms with Controlled Pulse Polarity," *IEEE Transactions on Magnetics*, vol. 24, No. 6, Nov. 1988, pp. 2530–2532.

Richard C. Schneider, "Write Equalization for Generalized (d,k) Codes," *IEEE Transactions on Magnetics*, vol. 24, No. 6, Nov. 1988, pp. 2533–2535.

Michael Melas, Patrick Arnett, and Jackyun Moon, "Noise in a Thin Metallic Medium: The Connection with Nonlinear Behaviour," *IEEE Transactions on Magnetics*, vol. 24, No. 6, Nov. 1988, pp. 2712–2714.

Jaekyun J. Moon and L. Richard Carley, "Partial Response Signaling in a Magnetic Recording Channel," *IEEE Transactions on Magnetics*, vol. 24, No. 6, Nov. 1988, pp. 2973–2975.

F. Dollvo, R. Hermann, and S. Olcer, "Performance and Sensitivity Analysis of Maximum–Likelihood Sequence Detection on Magnetic Recording Channels," *IEEE Transactions on Magnetics*, vol. 25, No. 5, Sep. 1989, pp. 4072–4074.

(List continued on next page.)

*Primary Examiner*—Young T. Tse
*Attorney, Agent, or Firm*—W. Daniels Swayze, Jr.; Wade James Brady, III; Richard L. Donaldson

[57] ABSTRACT

A phase locked loop system (52) and method is used in a synchronously sampled data channel (10) of a disk drive mass storage system (30).

21 Claims, 2 Drawing Sheets

OTHER PUBLICATIONS

Roger Wood, "New Detector for 1,k Codes Equalized to Class II Partial Response," *IEEE Transactions on Magnetics*, vol. 25, No. 5, Sep. 1989, pp. 4075–4077.

J.W.M. Bergmans, S. Mita, and M. Izumita, "Characterization of Digital Recording Channels by Means of Echo Cancellation Techniques," *IEEE Transactions on Magnetics*, vol. 25, No. 5, Sep. 1989, pp. 4078–4080.

Yinyi Lin, "An Estimation Technique for Accurately Modelling the Magnetic Recording Channel Including Nonlinearities," *IEEE Transactions on Magnetics*, vol. 25, No. 5, Sep. 1989, pp. 4084–4086.

Anthony D. Weathers, Catherine A. French, and Jack Keil Wolf, "Results on 'Controlled Polarity' Modulation and Coding," *IEEE Transactions on Magnetics*, vol. 25, No. 5, Sep. 1989, pp. 4090–4092.

Catherine A. French, "Distance Preserving Run–Length Limited Codes," *IEEE Transactions on Magnetics*, vol. 25, No. 5, Sep. 1989, pp. 4093–4095.

Lyle J. Fredrickson and Jack Keil Wolf, "Error Detecting Multiple Block (d,k) Codes," *IEEE Transactions on Magnetics*, vol. 25, No. 5, Sep. 1989, pp. 4096–4098.

Roger Wood, "Enhanced Decision Feedback Equilization," *IEEE Transactions on Magnetics*, vol. 26, No. 5, Sep. 1990, pp. 2178–2180.

Thomas D. Howell, Donald P. McCown, Thomas A. Diola, Yaw–shing Tang, Karl R. Hense, Ralph L. Gee, "Error Rate Performance of Experimental Gigabit Per Square Inch Recording Components," *IEEE Transactions on Magnetics*, vol. 26, No. 5, Sep. 1990, pp. 2298–2302.

Pantas Sutardja, "A Post–Compensation Scheme for Peak–Detect Channel," *IEEE Transactions on Magnetics*, vol. 26, No. 5, Sep. 1990, pp. 2303–2305.

L.L. Nunnelley, M.A. Burleson, L.L. Williams, and I.A. Beardsley, "Analysis of Asymmetric Deterministic Bitshift Errors in a Hard Disk File," *IEEE Transactions on Magnetics*, vol. 26, No. 5, Sep. 1990, pp. 2306–2308.

H.K. Thapar, N.P.Sands, W.L. Abbott, and J.M. Cioffi, "Spectral Shaping for Peak Detection Equalization," *IEEE Transactions on Magnetics*, vol. 26, No. 5, Sep. 1990, pp. 2309–2311.

Lyle J. Fredrickson, "Coding for Maximum Likelihood Detection on a Magnetic Recording Channel," *IEEE Transactions on Magnetics*, vol. 26, No. 5, Sep. 1990, pp. 2315–2317.

Lyle J. Fredrickson, "A (D,K,C)=(0,3,5/2) Rate 8/10 Modulation Code," *IEEE Transactions on Magnetics*, vol. 26, No. 5, Sep. 1990, pp. 2318–2320.

R. Hermann, "Volterra Modeling of Digital Magnetic Saturation Recording Channels," *IEEE Transactions on Magnetics*, vol. 26, No. 5, Sep. 1990, pp. 2125–2127.

Roger Wood, Mason Williams, and John Hong, "Considerations for High Data Rate Recording with Thin–Film Heads," *IEEE Transactions on Magnetics*, vol. 26, No. 6, Nov. 1990, pp. 2954–2959.

Jaekyun Moon and L. Richard Carley, "Performance Comparison of Detection Methods in Magnetic Recording," *IEEE Transactions on Magnetics*, vol. 26, No. 6, Nov. 1990, pp. 3155–3172.

William L. Abbott, John M. Cioffi, and Hermant K. Thapar, "Performance of Digital Magnetic Recording with Equalization and Offtrack Interference," *IEEE Transactions on Magnetics*, vol. 27, No. 1, Jan. 1991, pp. 705–716.

Jan W.M. Bergmans, Seiichi Mita, and Morishi Izumita, "A Simulation Study of Adaptive Reception Schemes for High–Density Digital Magnetic Storage," *IEEE Transactions on Magnetics*, vol. 27, No. 1, Jan. 1991, pp. 717–723.

Ching Tsang and Yaw–Shing Tang, "Time–Domain Study of Proximity–Effect Induced Transition Shifts," *IEEE Transactions on Magnetics*, vol. 27, No. 2, Mar. 1991, pp. 795–802.

K.B. Klaassen, "Magnetic Recording Channel Front–Ends," *IEEE Transactions on Magnetics*, vol. 27, No. 6, Nov. 1991, pp. 4503–4508.

John Hong, Roger Wood, David Chan, "An Experimental 180 Mb/sec PRML Channel for Magnetic Recording," *IEEE Transactions on Magnetics*, vol. 27, No. 6, Nov. 1991, pp. 4532–4537.

Jonathan D. Coker, Richard L. Galbraith, and Gregory J. Kerwin, "Magnetic Characterization using Elements of a PRML Channel," *IEEE Transactions on Magnetics*, vol. 27, No. 6, Nov. 1991, pp. 4544–4548.

L. Richard Carley and John G. Kenney, "Comparison of Computationally Efficient Forms of FDTS/DF Against PR4–ML," *IEEE Transactions on Magnetics*, vol. 27, No. 6, Nov. 1991, pp. 4567–4572.

Jaekyun Moon, "Discrete–Time Modeling of Transition–Noise Dominant Channels and Study of Detection Performance," *IEEE Transactions on Magnetics*, vol. 27, No. 6, Nov. 1991, pp. 4573–4578.

Jack Keil Wolf, "A Survey of Codes for Partial Response Channels," *IEEE Transactions on Magnetics*, vol. 27, No. 6, Nov. 1991, pp. 4585–4589.

Norman L. Koren, "Matched Filter Limits and Code Performance in Digital Magnetic Recording," *IEEE Transactions on Magnetics*, vol. 27, No. 6, Nov. 1991, pp. 4594–4599.

H.M. Hilden, D.G. Howe, and E.J. Weldon, Jr., "Shift Error Correcting Modulation Codes," *IEEE Transactions on Magnetics*, vol. 27, No. 6, Nov. 1991, pp. 4600–4605.

Derek D. Kumar and Bill J. Hunsinger, "ACT–enabled 100MHz Channel Equalizer," *IEEE Transactions on Magnetics*, vol. 27, No. 6, Nov. 1991, pp. 4799–4803.

Alan J. Armstrong and Jack Keil Wolf, "Performance Evaluation of a New Coding Scheme for the Peak Detecting Magnetic Recording Channel," *IEEE Transactions on Magnetics*, vol. 27, No. 6, Nov. 1991, pp. 4804–4806.

S. Raghavan and H.K. Thapar, "Feed–Forward Timing Recovery for Digital Magnetic Recording," *International Conference on Communications Conference Record*, vol. 2, 1991, pp. 794–798.

S.A. Raghavan and H.K. Thapar, "On Feed–Forward and Feedback Timing Recovery for Digital Magnetic Recording Systems," *IEEE Transactions on Magnetics*, vol. 27, No. 6, Nov. 1991, pp. 4810–4812.

James Fitzpatrick and Jack Keil Wolf, "A Maximum Likelihood Detector for Nonlinear Magnetic Recording," *IEEE Transactions on Magnetics*, vol. 27, No. 6, Nov. 1991, pp. 4816–4818.

John G. Kenney, Peter Alexis McEwen, and L. Richard Carley, "Evaluation of Magnetic Recording Detection Schemes for Thin Film Media," *IEEE Transactions on Magnetics*, vol. 27, No. 6, Nov. 1991, pp. 4822–4824.

Pablo A. Ziperovich, "Performance Degradation of PRML Channels Due to Nonlinear Distortions," *IEEE Transactions on Magnetics*, vol. 27, No. 6, Nov. 1991, pp. 4825–4827.

Jaekyun Moon and Jian–Gang Zhu, "Nonlinear Effects of Transition Broadening," *IEEE Transactions on Magnetics*, vol. 27, No. 6, Nov. 1991, pp. 4831–4833.

Jaekyun Moon, "Signal–to–Noise Ratio Degradation with Channel Mismatch," *IEEE Transactions on Magnetics*, vol. 27, No. 6, Nov. 1991, pp. 4837–4839.

R.D. Barndt, A.J. Armstrong, H.N. Bertram, and J.K. Wolf, "A Simple Statistical Model of Partial Erasure in Thin Film Disk Recording Systems," *IEEE Transactions on Magnetics*, vol. 27, No. 6, Nov. 1991, pp. 4978–4980.

Y. Tang and C. Tsang, "A Technique for Measuring Nonlinear Bit Shift," *IEEE Transactions on Magnetics*, vol. 27, No. 6, Nov. 1991, pp. 5316–5318.

R.D. Barndt and J.K. Wolf, "Modeling and Signal Processing for the Nonlinear Thin Film Recording Channel," *IEEE Transactions on Magnetics*, vol. 28, No. 5, Sep. 1992, pp. 2710–2712.

H. Thapar, J. Rae, C. Shung, R. Karabed, and P. Siegel, "On the Performance of a Rate 8/10 Matched Spectral Null Code for Class–4 Partial Response," *IEEE Transactions on Magnetics*, vol. 28, No. 5, Spe. 1992, pp. 2883–2888.

Hamid Shafiee and Jaekyun Moon, "Low–Complexity Viterbi Detection for a Family of Partial Response Systems†," *IEEE Transactions on Magnetics*, vol. 28, No. 5, Sep. 1992, pp. 2892–2894.

Weining Zeng and Jaekyun Moon, "Modified Viterbi Algorithm for a Jitter–dominant $1-D^2$ Channel," *IEEE Transactions on Magnetics*, vol. 28, No. 5, Sep. 1992, pp. 2895–2897.

William E. Ryan, "Comparative Performance Between Drop–Out Detection and Viterbi Reliability Metric Erasure Flagging," *IEEE Transactions on Magnetics*, vol. 28, No. 5, Sep. 1992, 2898–2900.

C. Menyennett, L. Botha, and H.C. Ferreira, "A NewRunlength Limited Code for Binary Asymmetric Channels," *IEEE Transactions on Magnetics*, vol. 28, No. 5, Sep. 1992, pp. 2901–2903.

Gang H. Lin, Rick Barndt, H. Neal Bertram, and Jack K. Wolf, "Experimental Studies of Nonlinearities in High Density Disk Recording," *IEEE Transactions on Magnetics*, vol. 28, No. 5, Sep. 1992, pp. 3279–3281.

Ralph Simmons and Robert Davidson, "Media Design for User Density of up to 3 Bits per Pulse Width," *IEEE Transactions on Magnetics*, vol. 29, No. 1, Jan. 1993, pp. 169–176.

Jaekyun Moon and Jian–Gang Zhu, "Nonlinearities in Thin–Film Media and Their Impact on Data Recovery," *IEEE Transactions on Magnetics*, vol. 29, No. 1, Jan. 1993, pp. 177–182.

R.D. Barndt, A.J. Armstrong , and J.K. Wolf, "Media Selection for High Density Recording Channels," *IEEE Transactions on Magnetics*, vol. 29, No. 1, Jan. 1993, pp. 183–188.

Dean C. Palmer and Jonathan D. Coker, "Media Design Considerations for a PRML Channel," *IEEE Transactions on Magnetics*, vol. 29, No. 1, Jan. 1993, pp. 189–194.

Zadian Software, Inc., *Disk Drive Technology*, Copyright 1990, San Jose, CA.

United States Patent Application for "System and Method for Reconstructing a Signal Wave in a Partial Response Read Channel," 32 pages of text and 8 figures. (Serial No. and filing date is unknown.).

Roy D. Cideciyan, Francois Dolivo, Reto Hermann, Walter Hirt, and Wolfgang Schott, "A PRML System for Digital Magnetic Recording," *IEEE Journal on Selected Areas in Communications*, vol. 10, No. 1, Jan. 1992, pp. 38–56.

Lyle J. Fredrickson, "Viterbi Detection of Matched Spectral Null codes for PR4 Systems," *IEEE Transactions on Magnetics*, vol. 28, No. 5, Sep. 1992, pp. 2889–2891.

K. Chopra and D.D. Woods, "A Maximum Likelihood Peak Detecting Channel," *IEEE Transactions on Magnetics*, vol. 27, No. 6, Nov. 1991, pp. 4819–4821.

Arvind M. Patel, "A New Digital Signal Processing Channel for Data Storage Products," *IEEE Transactions on Magnetics*, vol. 27, No. 6, Nov. 1991, pp. 4579–4584.

Richard C. Schneider, "Sequence (Viterbi–Equivalent) Decoding," *IEEE Transactions on Magnetics*, vol. 24, No. 6, Nov. 1988, pp. 2539–2541.

J.D. Coker, R.L. Galbraith, G.J. Kerwin, J.W. Rae, P.A. Ziperovich, "Implementation of PRML in a Rigid Disk Drive," *IEEE Transactions on Magnetics*, vol. 27, No. 6, Nov. 1991, pp. 4538–4543.

H. Kobayashi and D.T. Tang, "Application of Partial–response Channel Coding to Magnetic Recording Systems," *IBM J. Res. Develop.*, Jul. 1970, pp. 368–375.

Kenneth Abend and Bruce D. Fritchman, "Statistical Detection for Communication Channels with Intersymbol Interference," *Proceedings of the IEEE*, vol. 58, No. 5, May 1970, pp. 779–785.

G. David Forney, Jr., "Maximum–Likelihood Sequence Estimation of Digital Sequences in the Presence of Intersymbol Interference," *IEEE Transactions on Information Theory*, vol. IT–18, No. 3, May 1972, pp. 363–378.

G. David Forney, Jr., "The Viterbi Algorithm," *Proceedings of the IEEE*, vol. 61, No. 3, Mar. 1973, pp. 268–278.

Gottfried Ungerboeck, "Adaptive Maximum–Likelihood Receiver for Carrier–Modulated Data–Transmission Systems," *IEEE Transactions on Communications*, vol. Com–22, No. 5, May 1974, pp. 624–636.

Peter Kabal and Subbarayan Pasupathy, "Partial–Response Signaling," *IEEE Transactions on Communications*, vol. Com–23, No. 9, Sep. 1975, pp. 921–934.

C.T. Beare, "The Choice of the Desired Impulse Response in Combined Linear–Viterbi Algorithm Equalizers," *IEEE Transactions on Communications*, vol. Com–26, No. 8, Aug. 1978, pp. 1301–1307.

R.A. Baugh, E.S. Murdock, and B.R. Natarajan, "Measurement of Noise in Magnetic Media," *IEEE Transactions on Magnetics*, vol. MAG–19, No. 5, Sep. 1983, pp. 1722–1724.

Hans Burkhardt and Lineu C. Barbosa, "Contributions to the Application of the Viterbi Algorithm," *IEEE Transactions on Information Theory*, vol. IT–31, No. 5, Sep. 1985, pp. 626–634.

Yaw–Shing Tang, "Noise Autocorrelation in Magnetic Recording Systems," *IEEE Transactions on Magnetics*, vol. MAG–21, No. 5, Sep. 1985, pp. 1389–1394.

Roger W. Wood and David A. Petersen, "Viterbi Detection of Class IV Partial Response on a Magnetic Recording Channel," *IEEE Transactions on Communications*, vol. COM–34, No. 5, May 1986, pp. 454–461.

Yaw–Shing Tang, "Noise Autocorrelation in High Density Recording on Metal Film Disks," *IEEE Transactions on Magnetics*, vol. MAG–22, No. 5, Sep. 1986, pp. 883–885.

C. Michael Melas, Patrick Arnett, Irene Beardsley, and Dean Palmer, "Nonlinear Superposition in Saturation Recording of Disk Media," *IEEE Transactions on Magnetics*, vol. MAG–23, No. 5, Sep. 1987, pp. 2079–2081.

PHASE LOCKED LOOP SYSTEM AND METHOD FOR USE IN A DATA CHANNEL

This application claims benefit of provisional application 60/015,830 filed Apr. 18, 1996.

TECHNICAL FIELD OF THE INVENTION

This invention relates generally to the field of information storage and more particularly to a phase locked loop system and method for use in a data channel for providing a read clock signal and a write clock signal.

BACKGROUND OF THE INVENTION

As computer hardware and software technology continues to progress, the need for larger and faster mass storage devices for storing computer software and data continues to increase. Electronic databases and computer applications such as multimedia applications require large amounts of disk storage space. An axiom in the computer industry is that there is no such thing as enough memory and disk storage space.

To meet these ever increasing demands, hard disk drives continue to evolve and advance. Some of the early disk drives had a maximum storage capacity of five megabytes and used fourteen inch platters, whereas today's hard disk drives are commonly over one gigabyte and use 3.5 inch platters. Correspondingly, advances in the amount of data stored per unit of area, or areal density, have dramatically accelerated. For example, in the 1980's, areal density increased about thirty percent per year while in the 1990's annual areal density increases have been around sixty percent. The cost per megabyte of a hard disk drive is inversely related to its areal density.

Mass storage device manufacturers strive to produce high speed hard disk drives with large data capacities at lower and lower costs. A high speed hard disk drive is one that can store and retrieve data at a fast rate. One aspect of increasing disk drive speed and capacity is to improve or increase the areal density. Areal density may be increased by improving the method of storing and retrieving data.

In general, mass storage devices and systems, such as hard disk drives, include a magnetic storage media, such as rotating disks or platters, a spindle motor, read/write heads, an actuator, a pre-amplifier, a read channel, a write channel, a servo controller, and control circuitry to control the operation of the hard disk drive and to properly interface the hard disk drive to a host or system bus. The read channel, write channel, servo controller, and memory may all be implemented as one integrated circuit that is referred to as a data channel. The control circuitry often includes a microprocessor for executing control programs or instructions during the operation of the hard disk drive.

A hard disk drive (HDD) performs write and read operations when storing and retrieving data. A typical HDD performs a write operation by transferring data from a host interface to its control circuitry. The control circuitry then stores the data in a local dynamic random access memory (DRAM). A control circuitry processor schedules a series of events to allow the information to be transferred to the disk platters through a write channel. The control circuitry moves the read/write heads to the appropriate track and locates the appropriate sector of the track. Finally, the HDD control circuitry transfers the data from the DRAM to the located sector of the disk platter through the write channel. A write clock controls the timing of a write operation in the write channel. The write channel may encode the data so that the data can be more reliably retrieved later. A sector generally has a fixed data storage capacity, such as 512 bytes of user data per sector.

In a read operation, the appropriate sector to be read is located and data that has been previously written to the disk is read. The read/write head senses the changes in the magnetic flux of the disk platter and generates a corresponding analog read signal. The read channel receives the analog read signal, conditions the signal, and detects "zeros" and "ones" from the signal. The read channel conditions the signal by amplifying the signal to an appropriate level using automatic gain control (AGC) techniques. The read channel then filters the signal, to eliminate unwanted high frequency noise, equalizes the channel, detects "zeros" and "ones" from the signal, and formats the binary data for the control circuitry. The binary or digital data is then transferred from the read channel to the control circuitry and is stored in the DRAM of the control circuitry. The processor then communicates to the host that data is ready to be transferred. A read clock controls the timing of a read operation in the read channel.

As the disk platters are moving, the read/write heads must align or stay on a particular track. This is accomplished by reading information from the disk called a servo wedge. Generally, each sector has a corresponding servo wedge. The servo wedge indicates the position of the heads. The data channel receives this position information so the servo controller can continue to properly position the heads on the track.

Traditional HDD read channels used a technique known as peak detection for extracting or detecting digital information from the analog information stored on the magnetic media. In this technique, the waveform is simply level detected and if the waveform level is above a threshold during a sampling window, the data is considered a "one." More recently, advanced techniques utilizing discrete time signal processing (DTSP) to reconstruct the original data written to the disk are being used in read channel electronics to improve areal density. In these techniques, the data is synchronously sampled using a data recovery clock. The sample is then processed through a series of mathematical manipulations using signal processing theory.

There are several types of synchronously sampled data (SSD) channels. Partial response, maximum likelihood (PRML); extended PRML (EPRML); enhanced, extended PRML (EEPRML); fixed delay tree search (FDTS); and decision feedback equalization (DFE) are several examples of different types of SSD channels using DTSP techniques. The maximum likelihood detection performed in several of these systems is usually performed by a Viterbi decoder implementing the Viterbi algorithm, named after Andrew Viterbi who developed it in 1967.

The SSD channel or read channel generally requires mixed-mode circuitry for performing a read operation. The circuitry may perform such functions as analog signal amplification, automatic gain control (AGC), continuous is time filtering, signal sampling, DTSP manipulation, timing recovery, signal detection, and formatting. In all SSD channels, the major goal during a read operation is to accurately retrieve the data with the lowest bit error rate (BE) in the highest noise environment. The data channel circuitry, including both a read channel and a write channel, may be implemented on a single integrated circuit package that contains various input and output (I/O) pins.

SSD channels use a read clock to control read operations and a write clock to control write operations and other non-read operations. During a write operation, a write clock or write timing signal is provided to the write channel to synchronize the writing or storing of data to the disk platters. During a read operation, a read clock or data recovery clock is provided to the read channel to synchronize the sampling of data being read from the disk platters. The read and write clocks may be provided at different frequencies to account for slight variations in the speed of the spindle motor.

The presence of separate read and write clocks creates several disadvantages and problems. The presence of two high frequency signal sources having similar frequencies, such as the read and write clocks, often cause interference between the two signals. This interference results in greater system noise and data errors. Separate read and write clocks suffer the additional disadvantages of increased circuitry, increased silicon, increased fabrication costs, and increased power consumption which is especially critical in portable or battery powered applications such as notebook or laptop computers.

SUMMARY OF THE INVENTION

From the foregoing it may be appreciated that a need has arisen for a phase locked loop system and method for use in a data channel of a mass storage system. In accordance with the present invention, a phase locked loop system is provided which substantially eliminates and reduces the disadvantages and problems of using separate phase locked loops, each having its own voltage controlled oscillator, to provide a read clock and a write clock. The phase locked loop system eliminates the problems associated with the presence of two high frequency signals having similar frequencies that may interfere with one another. This reduces noise and the possibility of data errors. The phase locked loop system also reduces circuitry, fabrication costs, and power consumption.

According to the present invention, a phase locked loop system is provided that is used to supply a read clock and a write clock. The phase locked loop system includes a read phase detector that receives a synchronously sampled data signal and a voltage controlled oscillator output clock signal and generates a read control voltage in response. A write phase detector is provided that receives a reference clock signal and the voltage controlled oscillator output clock signal and generates a write control voltage during a non-read operation. During read operations, the write phase detector provides the last write control voltage provided before transitioning from a non-read operation to a read operation. An adder circuit is provided that receives the read control voltage and the write control voltage and generates a voltage controlled oscillator input voltage. Finally, a voltage controlled oscillator is provided that receives the voltage controlled oscillator input voltage and provides a voltage controlled oscillator output clock signal. The voltage controlled oscillator output clock signal serves as the read clock during read operations and as the write clock during non-read operations.

The present invention provides various technical advantages over previously developed phase locked loops used in a mass storage system. For example, a technical advantage of the present invention includes the use of a phase locked loop system in a data channel for time base generation and read synchronization instead of using multiple phase locked loops to accomplish the same. The phase locked lcop system only requires one voltage controlled oscillator which results in reduced circuitry, reduced silicon, reduced fabrication costs, and reduced power requirements. Another technical advantage of using a phase locked loop system includes the elimination of a second high frequency signal source. A second high frequency signal source potentially introduces noise and interference into the circuitry. This is especially troublesome when two high frequency signal sources are operating at close to the same frequency, such as the case of a read and write clock of a data channel. Other technical advantages are readily apparent to one skilled in the art from the following figures, description, and claims.

BRIEF DESCRIPTION OF THE DRAWINGS

For a more complete understanding of the present invention and the advantages thereof, reference is now made to the following brief description, taken in connection with the accompanying drawings and detailed description, wherein like reference numerals represent like parts, in which.

DETAILED DESCRIPTION OF THE INVENTION

Figure 1:
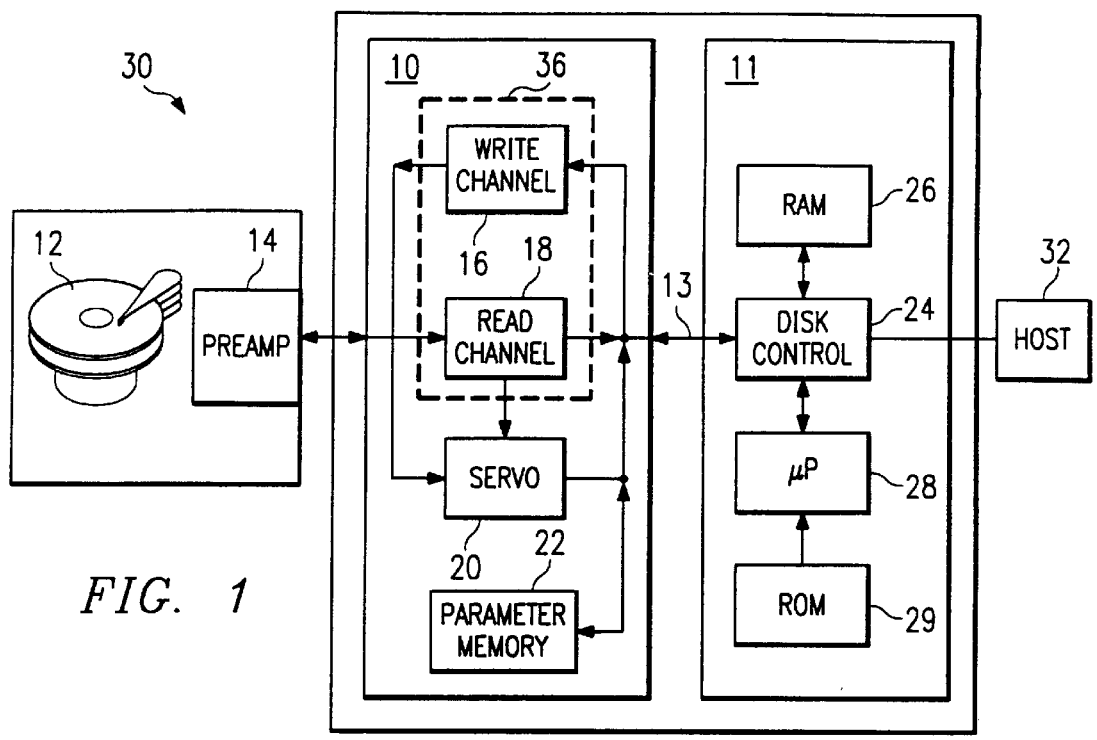
FIG. 1 is a block diagram illustrating a disk drive mass storage system.

FIG. 1 is a block diagram of a disk drive mass storage system 30 used for retrieving data during read operations and for storing data during write operations. Disk drive mass storage system 30 interfaces and exchanges data with a host 32 during read and write operations. Disk drive mass storage system 30 includes a disk/head assembly 12, a preamplifier 14, a synchronously sampled data (SSD) channel 10, and a control circuitry 11. Disk/head assembly 12 and preamplifier 14 are used to magnetically store data. SSD channel 10 and control circuitry 11 are used to process data that is being read from and written to disk/head assembly 12 and to control the various operations of disk drive mass storage system 30. Host 32 exchanges digital data with control circuitry 11.

Disk/head assembly 12 includes a number of rotating magnetic disks or platters used to store data that is represented as magnetic transitions on the magnetic platters. The read/write heads of disk/head assembly 12 are used to store and retrieve data from each side of the magnetic platters. The read/write heads may be any number of available read/write heads such as magneto-resistive heads. Preamplifier 14 interfaces between the read/write heads of disk/head assembly 12 and SSD channel 10 and provides amplification to the waveform data signals as needed.

SSD channel 10 is used during read and write operations to exchange analog data signals with disk/head assembly 12 through preamplifier 14 and to exchange digital data signals with control circuitry 11 through a data/parameter path 13. SSD channel 10 includes a write channel 16, a read channel 18, a servo control 20, and a parameter memory 22. SSD channel 10 may be implemented as a single integrated circuit. The phantom box surrounding read channel 18 and write channel 16 illustrates data channel 36 which is the combination of read channel 18 and write channel 16. Data channel 36, illustrated more fully in FIG. 2, may be implemented as a single integrated circuit. The timing of data channel 36, during both read and write operations, is controlled by a phase locked loop system not shown in FIG. 1 but described more fully below.

During write operations, write channel 16 receives digital data from control circuitry 11 in parallel format through data/parameter path 13. The digital data is reformatted for storage and provided to disk/head assembly 12. Write channel 16 may include a register, a scrambler, an encoder, a serializer, and a write precompensation circuit. The operation and timing of write channel 16 is controlled by a phase locked loop system described more fully below.

During read operations, read channel 18 receives analog data signals from disk/head assembly 12 through preamplifier 14. Read channel 18 conditions, decodes, and formats the analog data signal and provides a digital data signal in parallel format to control circuitry 11 through data/parameter path 13. Read channel 18 includes any of a variety of circuit modules such as an automatic gain control circuit, a low pass filter, a sampler, an equalizer, such as a finite impulse response filter, a maximum likelihood, partial response detector, a deserializer, and a synchronization field detection circuit. The timing and operation of read channel 18 is controlled by the phase locked loop system described more fully below. Read channel 18 and write channel 16 are illustrated more fully in FIG. 2.

The various circuit modules of SSD channel 10 may receive operational parameters for enhanced or optimal performance. The operational parameters are generally calculated during burn-in but may be calculated at other times. The operational parameters are used to enhance the operation of SSD channel 10. The operational parameters are also designed to account for the various physical and magnetic characteristics of disk drive mass storage system 30 that vary from system to system and influence operational performance. During start-up, the operational parameters are provided to SSD channel 10 from control circuitry 11 through data/parameter path 13. Parameter memory 22 stores the operational parameters. The various circuit modules may then access the operational parameters from parameter memory 22.

Servo control 20 provides position error signals (PES) to control circuitry 11 during read and write operations. The PES relate to the position of the heads of disk/head assembly 12 so that the heads can be properly positioned during both read and write operations.

Control circuitry 11 is used to control the various operations of disk drive mass storage system 30 and to exchange digital data with SSD channel 10 and host 32. Control circuitry 11 includes a microprocessor 28, a disk control 24, a random access memory (RAM) 26, and a read only memory (ROM) 29. Microprocessor 28, disk control 24, RAM 26, and ROM 29 together provide control and logic functions to disk drive mass storage system 30 so that data may be received from host 32, stored, and later retrieved and provided back to host 32. ROM 29 stores preloaded microprocessor instructions for use by microprocessor 28 in operating and controlling disk drive mass storage system 30. ROM 29 may also stores the operational parameters that are supplied to parameter memory 22 during start-up. RAM 26 is used for storing digital data for write operations and for storing digital data that has been generated as a result of a read operation. Disk control 24 includes various logic and bus arbitration circuitry used in properly interfacing disk drive mass storage system 30 to host 32 and for internally interfacing control circuitry 11 to SSD channel 10. Depending. on the circuit implementation, any of a variety of circuitry may be used in disk control 24.

In operation, disk drive mass storage system 30 goes through an initialization or start-up routine when power is initially provided. One such routine instructs microprocessor 28 to supply the operational parameters, previously stored in ROM 29, to parameter memory 22 through data/parameter path 13. The operational parameters are then stored in memory registers of parameter memory 22 for use by read channel 18 during a read operation.

After the initialization routine is complete, data may be read from or written to disk/head assembly 12. Servo control 20 provides location information so that the read/write heads may be properly positioned on the disks to read and write data. In general, the operation of disk drive mass storage system 30 may be divided into read operations and non-read operations. Read operations involve the reading of data from the disks of disk head assembly 12 and non-read operations include write operations, servo operations, and times when the system is idle. A clock signal is provided from the phase locked loop system to control both read operations and non-read operations.

During a read operation, host 32 initiates a request for data. After the read/write heads of disk/head assembly 12 are properly positioned, an analog data signal is provided to preamplifier 14. Read channel 18 receives the analog data signal from preamplifier 14, processes the analog data signal, and provides a corresponding digital data signal. This involves using various circuitry modules and techniques for synchronously sampling the analog data signal and detecting a digital signal. The phase locked loop system provides a read clock signal to ensure that the data signal is synchronously sampled in the correct manner. Read channel 18 provides the digital data signal to disk control 24 through data/parameter path 13. Disk control 24 provides various digital logic control and arbitration circuitry between SSD channel 10, host 32, RAM 26, microprocessor 28, and ROM 29 during both read and write operations. The digital data is then stored in RAM 26 until microprocessor 28 communicates to host 32 that the data is ready to be transferred. Host 32 may be a system bus such as the system bus of a personal computer.

During a write operation, a digital data signal is received from host 32 and ultimately stored on disk/head assembly 12. Digital data is initially provided from host 32 to control circuitry 11. Control circuitry 11 stores the digital data in RAM 26. Microprocessor 28 schedules a series of events so that the data may then be transferred from RAM 26 to disk/head assembly 12 through write channel 16. This data exchange occurs through data/parameter path 13. Write channel 16 encodes the digital data and places the data in serial format. Write channel 16 then provides the data to disk/head assembly 12 after the heads of disk/head assembly 12 have been properly positioned to write or store the data at an appropriate location on the disk. The operation and timing of write channel 16 is controlled by a write clock signal provided by the phase locked loop system.

Figure 2:
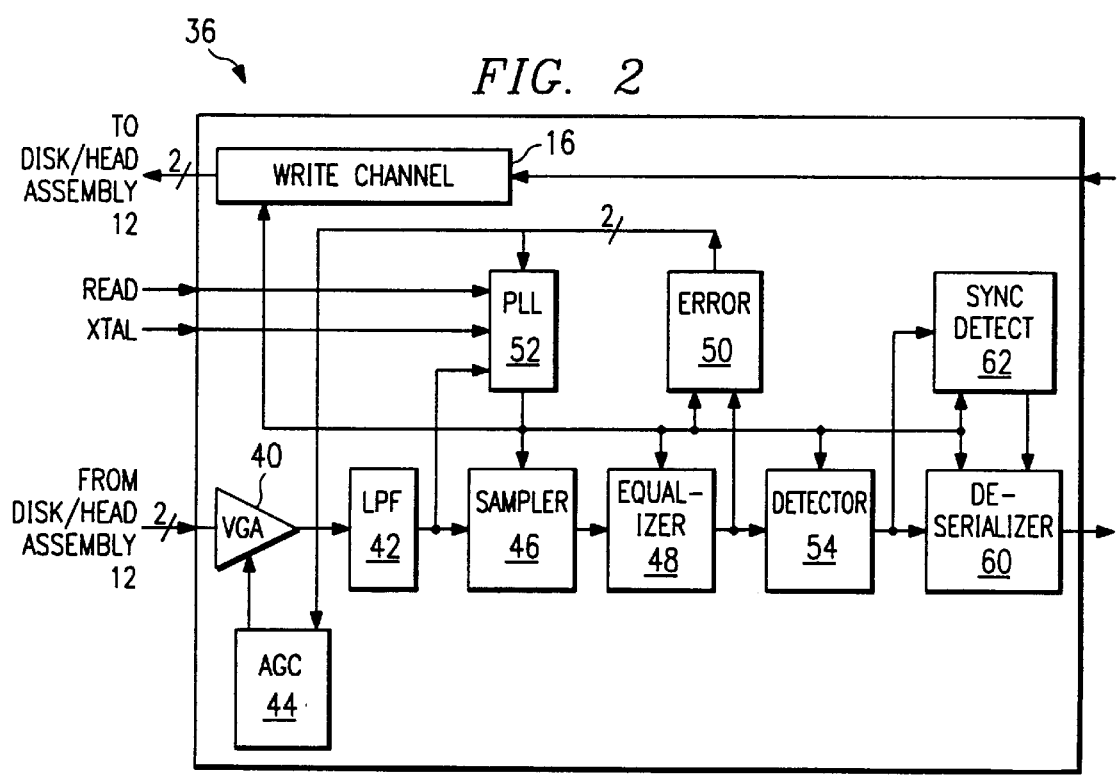
FIG. 2 is a block diagram illustrating a data channel of the disk drive mass storage system.

FIG. 2 is a block diagram of data channel 36. Data channel 36 includes read channel 18 and write channel 16, as illustrated in FIG. 1. Data channel 36 is used for performing read operations and write operations.

During a read operation, data channel 36 receives an analog read signal from disk/head assembly 12 at a variable gain amplifier (VGA) 40. Data channel 36 synchronously samples and processes the read signal and provides a corresponding digital data output signal from a deserializer 60. During a write operation, write channel 16 receives a digital data signal, processes and codes the signal, and provides a data signal to disk/head assembly 12 for magnetic storage. A phase locked loop system (PLL) 52 provides a read clock and a write clock that control the timing of read and write operations.

Read channel 18, shown as a block in FIG. 1, includes a variety of circuit modules used to synchronously sample, process, and condition an analog read signal during a read operation. Read channel 18 includes a VGA 40, an automatic gain control circuit (AGC) 44, a low pass filter (LPF) 42, a PLL 52, a sampler 46, an equalizer 48, an error circuit 50, a detector 54, a synchronization detection circuit (sync detect) 62, and a deserializer 60. All of these circuit modules are used during a read operation to condition and analyze the analog read signal to provide a corresponding digital data signal. The combination or subcombination of all of these circuit modules may be referred to as a read channel processing circuit. A read operation is performed when the READ signal is enabled indicating that a read operation is to be performed.

VGA 40 receives and amplifies the analog read signal from disk/head assembly 12 through preamplifier 14. VGA 40, along with AGC 44, work together to provide an appropriate amplification to the analog read signal. AGC 44 receives feedback signals from error circuit 50 so that appropriate adjustments can be made in the amplification or gain provided to the analog read signal by VGA 40.

The amplified analog read signal is provided by VGA 40 to LPF 42 for further processing. LPF 42 receives the amplified analog read signal and filters the signal to remove unwanted high frequency noise. LPF 42 also provides waveform shaping with amplitude boost. LPF 42 may be a continuous time 7th order filter designed using Gm/C components. The cutoff frequency and boost of LPF 42 may be programmable. The filtered output signal of LPF 42 is provided to sampler 46.

Sampler 46 samples the filtered output signal from LPF 42 and provides a discrete analog output signal having discrete values. Sampler 46 converts the filtered output signal from continuous time to discrete time. The filtered output signal is sampled synchronously at times that correspond to the various magnetic transitions stored on disk/head assembly 12. These magnetic transitions correspond to the data stored on disk/head assembly 12. Sampler 46 samples the signal and holds the value until the next sample occurs. PLL 52 controls when the samples occur in sampler 46 by providing a read clock signal to sampler 46 indicating when sampler 46 should sample and hold the filtered output signal. Each discrete value of the discrete analog output signal corresponds to the value or amplitude of the filtered output signal at the time the signal was sampled by sampler 46. Sampler 46 may be a sample and hold circuit such as a circular sample and hold circuit that is time sequence multiplexed to equalizer 48 so that the correct time sequenced value is presented to equalizer 48.

Equalizer 48 receives the discrete analog output signal from sampler 46 and provides a discrete, equalized read signal having discrete levels corresponding to the magnetic transitions on disk/head assembly 12. Equalizer 48 equalizes the signal by receiving a plurality of filter coefficients or taps and uses them in equalizing or filtering the signal. The discrete analog output signal is equalized to the target function of detector 54.

Equalizer 48 includes a plurality of multipliers. Each multiplier receives one of the plurality of filter coefficients and a consecutive discrete value of the discrete analog output signal. The outputs of each of the multipliers are then provided as inputs to an adder, such as an analog summer, which sums the inputs and provides the discrete, equalized read signal. As the discrete analog output signal changes, the consecutive discrete values of the discrete analog output signal that are provided to each multiplier are shifted to the next multiplier such that a new discrete value is now provided to the first multiplier and the oldest discrete value is dropped from the last multiplier.

Equalizer 48 may be a finite impulse response filter having five tap filter with coefficients set by programmable digital circuitry. Equalizer 48 would then receive five digital coefficients or filter tap weights that are converted to an analog value through a digital-to-analog converter. Each coefficient is then provided to a separate multiplier. The outputs of all five of the multipliers are provided to an analog summer to provide the discrete, equalized read signal. Although five coefficients or taps are described, the number of coefficients or taps and the corresponding number of multipliers may vary.

Detector 54 receives the discrete, equalized read signal from equalizer 48. Detector 54 analyzes the signal and generates the digital data output signal corresponding to the data stored on disk/head assembly 12. In one embodiment, detector 54 may be a maximum likelihood detector or Viterbi decoder implementing the Viterbi algorithm. Assuming that detector 54 is implemented as a Viterbi decoder, detector 54 includes a metric circuit, and a trellis circuit for analyzing the signal. The metric circuit receives the discrete, equalized read signal from equalizer 48 and performs an add, compare, and select function to determine whether a magnetic transition may or may not have occurred on the disk. The output of the metric circuit is provided to the trellis circuit which acts as a decision tree for sequence decoding. The trellis circuit generates the digital data output signal which serves as the output of detector 54.

Sync detect 62 receives the digital data output signal and provides a synchronization detect signal. Sync detect 62 searches for the presence of a synchronization field or byte in the digital data output signal and enables the synchronization detect signal when a synchronization byte is detected. Sync detect 62 may search for the synchronization byte over a predefined period or "window" of time that the synchronization byte should be present. Sync detect 62 may include a register for storing a predefined synchronization byte and digital logic circuitry to compare the digital data output to the predefined synchronization byte.

Deserializer 60 receives the digital data output signal and the synchronization detect signal. The digital data output signal is provided as an output in parallel format when the synchronization detect signal is enabled by sync detect 62. Deserializer 60 places the digital data output signal in an appropriate parallel format such as an eight or nine-bit format.

Error circuit 50 receives the discrete, equalized read signal from equalizer 48 and generates an error signal in response. The error signal serves as an input to PLL 52 and AGC 44. The error signal indicates how far the discrete values of the discrete, equalized read signal differ from an ideal target value. The error signal may be provided as two signals, the first as a level or band signal indicating which band the discrete, equalized read signal is located, and the second as a difference signal indicating the difference between the discrete, equalized read signal and a target value of the band in which the signal is located. A positive and negative target value and a positive and negative threshold value may be provided to error circuit 50 for use in calculating the error signal. Error circuit 50 may employ any of a variety of circuitry to provide the error signal. Such circuitry may include comparators to compare the discrete values of the discrete, equalized signal to the threshold values. A sample/hold circuit and an adder circuit may be used to sample the discrete, equalized signal and to add or subtract the sampled value to/from the target values.

Figure 4:
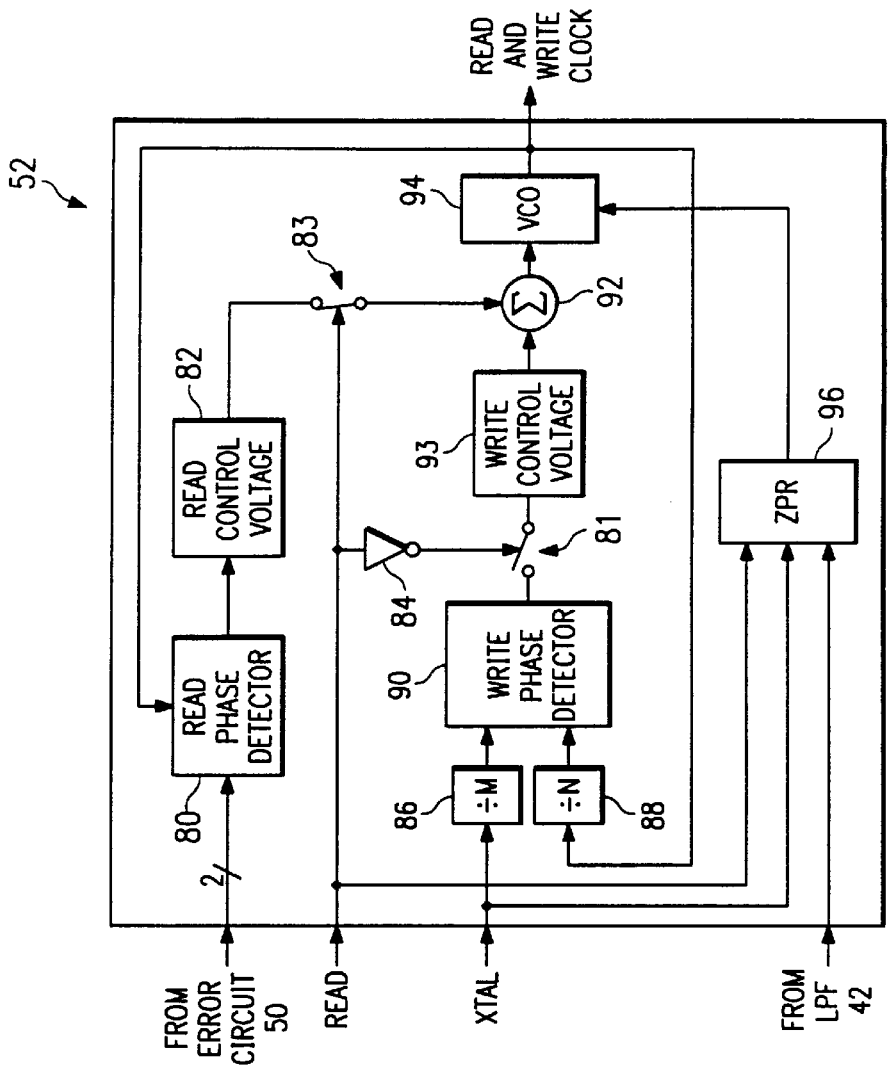
FIG. 4 is an expanded block diagram illustrating the phase locked loop system of the data channel.

PLL 52 provides an output clock signal that serves as a read clock signal during read operations and as a write clock signal during non-read operations. During read operations, PLL 52 controls when sampler 46 samples the filtered output signal provided by LPF 42. PLL 52 receives the error signal, a crystal clock signal (XTAL), a read enable signal, and the filtered output signal of LPF 42 and provides a read clock signal throughout read channel 18 during read operations. PLL 52, illustrated in FIGS. 3 and 4, provides a read clock signal during read operations and provides a write clock signal during write operations.

Write channel 16 includes various circuitry to process a digital data signal. A write operation is performed in write channel 16 when the READ signal is not enabled, indicating that a write or non-read operation is to be performed. Just as in a read operation in read channel 18, the timing of a write operation is controlled by the output clock signal provided by PLL 52. A write clock signal is provided as the output of PLL 52 during a write or non-read operation.

Write channel 16 may include any number of circuit modules or elements to process the digital data signal. Such circuity may include a scrambler circuit to randomize the data, an encoder, a serializer, and a write precompensation circuit. For example, write channel 16 normally will include circuitry to encode the digital data signal. The digital data signal may be encoded using a run-length limited (RLL) encoder which enforces the (0,4,4) constraint and converts the digital data signal from eight bits to nine bits before being stored. A serializer would then place the parallel data into serial format and provide the serial data to a write precompensation circuit which may provide delays to the data. The write precompensation circuit uses the write clock signal provided by PLL 52 to timely provide the data to disk/head assembly 12 during a write operation.

Figure 3:
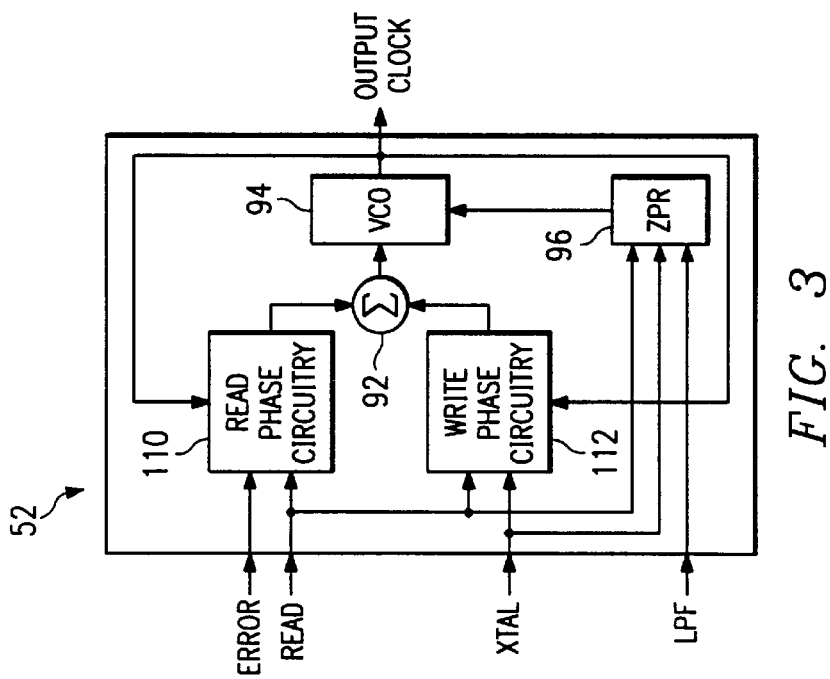
FIG. 3 is an overview block diagram illustrating a phase locked loop system used in the data channel.

FIG. 3 is an overview block diagram of PLL 52. PLL 52 provides a read clock signal to read channel 18 during read operations and a write clock signal to write channel 16 during non-read operations. PLL 52 includes a read phase circuitry 110, a write phase circuitry 112, a zero phase restart circuit (ZPR) 96, an adder circuit 92, and a voltage controlled oscillator (VCO) 94. PLL 52 receives a read enable signal, depicted as READ; a reference clock signal, depicted as XTAL; an error signal from error circuit 50; and a filtered output signal from LPF 42. The output clock signal of PLL 52 is provided through the output of VCO 94.

Write phase circuitry 112 receives the read enable signal, the reference clock signal, and the output clock signal of VCO 94 and generates a write control voltage during non-read operations. Write phase circuitry 112 generates the write control voltage by determining the phase difference between the reference clock signal and the output clock signal. The write control voltage is provided to adder circuit 92. During read operations, write phase circuitry 112 maintains the last write control voltage provided before the transition from a read operation to a non-read operation. This value is also provided to adder circuit 92.

Read phase circuitry 110 receives the read enable signal, the error signal, and the output clock signal of VCO 94 and generates a read control voltage in response. Read phase circuitry 110 generates the read control voltage by determining the phase difference between the error signal and the output clock signal. The read control voltage is provided to adder circuit 92 during read operations.

ZPR 96 resets the output clock signal when transitions occur from read operations to non-read operations and from non-read operations to read operations. ZPR 96 stops and restarts VCO 94 to minimize the phase difference between the output clock signal and another signal. The phase difference between the output clock signal and the filtered output signal from LPF 42 is minimized when a transition occurs from a read operation to a non-read operation. The phase difference between the voltage controlled oscillator output clock signal and the reference clock signal is minimized when a transition occurs from a non-read operation to a read operation.

In operation, adder circuit 92 receives the read control voltage and the last write control voltage during read operations and generates an output voltage corresponding to the sum of these two voltages. As mentioned above, the last write control voltage is maintained by write phase circuitry 112 after the last non-read operation. Adder circuit 92 provides its output to VCO 94 which generates and adjusts frequency of the output clock signal in response. The output clock signal serves as a read clock signal during read operations.

During non-read operations, such as a write operation, adder circuit 92 receives the write control voltage and provides this voltage to VCO 94 which generates and adjusts the output clock signal in response. This output clock signal serves as a write clock signal during non-read operations.

FIG. 4 is an expanded block diagram of PLL 52 illustrating one embodiment of the phase locked loop system. PLL 52 provides a read clock signal to read channel 18 during read operations and a write clock signal to write channel 16 during non-read operations. The same write clock signal is provided during other non-read operations such as servo operations and during idle times. PLL 52 includes a read phase detector 80, a read control voltage circuit 82, a write phase detector 90, a write control voltage circuit 93, ZPR 96, adder circuit 92, and VCO 94. A read switch 83, a write switch 81, a read enable inverter 84, a divide-by-M circuit 86, a divide-by-N circuit 88 are also used in PLL 52 to ensure that the correct voltage is applied to VCO 94 during read and non-read operations. VCO 94 provides an output clock signal which serves as the output of PLL 52. The output clock signal serves as the read clock signal during read operations and as the write clock signal during non-read operations.

When PLL 52 transitions from a read operation to a non-read operation, the read enable signal transitions from an enabled state to a non-enabled state. As a result of this transition, ZPR 96 stops and restarts VCO 94 such that the phase error at the inputs to write phase detector 90 is minimized. The transition also results in the opening of read switch 83 and the closing of write switch 81 due to an enabling signal being provided at the output of read enable inverter 84. As a result, only the output of write control voltage circuit 93 is provided as an input to adder circuit 92. The output of read control voltage circuit 82 is not provided to adder circuit 92 due to the open circuit condition at read switch 83. The output of write phase detector 90 is provided as an input to write control voltage circuit 93 due to the closed circuit condition of write switch 81.

During a write operation, or any other non-read operation, a reference clock signal is provided to divide-by-M circuit 86. The output clock signal of VCO 94 is provided to divide-by-N circuit 88. Divide-by-M circuit 86 and divide-by-N circuit 88 are frequency divider circuits that receive an input signal at an input frequency and provide an output signal at an output frequency equal to some integral submultiple of the input frequency. Divide-by-M circuit 86 and divide-by-N circuit 88 use a random sequence generator to determine the divide amount. N and M are integer values that may be stored and provided in programmable memory registers. Write phase detector 90 receives the output signal of divide-by-M circuit 86 and divide-by-N circuit 88 and compares these two signals to produce an output signal that corresponds to the phase difference between these two input signals. The frequency of the output signal generated by write phase detector 90, as a result of receiving inputs from divide-by-M circuit 86 and divide-by-N circuit 88, is determined by the following relationship:

$$f_{90} = \frac{N}{M} \times f_{XTAL}$$

where $f_{90}$ is the frequency of the output signal of write phase detector 90; N and M are integer values; and $f_{XTAL}$ is the frequency of the reference clock signal.

The output signal of write phase detector 90 is provided to write control voltage circuit 93 during write operations, when write switch 81 is closed. Write control voltage circuit 93 generates or adjusts a write control voltage in response and provides this voltage to adder circuit 92. Write control voltage circuit 93 may be a second order loop filter capacitor that is used to generate and accurately maintain the write control voltage.

The write control voltage is provided as an input to adder circuit 92 during the write operation. Adder circuit 92 provides this voltage as an input to VCO 94. Thus the input voltage provided to VCO 94 during a write operation corresponds to the phase difference between the two signals provided to write phase detector 90. VCO 94 adjusts the frequency of its output clock signal based on this input voltage. The output clock signal is provided to write channel 16 and serves as the write clock signal during write operations. The signal is also provided as a feedback signal to divide-by-N circuit 88 so that the phase difference can be continually generated by write phase detector 90 to provide adjustments to the write clock signal throughout a write operation.

When PLL 52 transitions from a write operation to a read operation, the read enable signal transitions from a non-enabled state to an enabled state. As a result of this transition, ZPR 96 initiates a zero phase restart in VCO 94. ZPR 96 stops and restarts.VCO 94 such that the phase error at the inputs to read phase detector 80 is minimized. LPF 42 provides a signal to zero phase restart circuit 96 that VCO 94 uses to minimize the phase error at the inputs of read phase detector 80. This transition also results in the opening of write switch 81 and the closing of read switch 83 so that the output of read control voltage circuit 82 and the output of write control voltage circuit 93 are coupled to adder circuit 92.

The opening of write switch 81 uncouples write phase detector 90 from write control voltage circuit 93. Although write control voltage circuit 93 is no longer coupled to write phase detector 90 during a read operation, write control voltage circuit 93 accurately maintains the last write control voltage generated before write switch 81 was opened.

During a read operation, read phase detector 80 receives an error signal provided by error circuit 50 and the output clock signal of VCO 94. Read phase detector 80 compares these two signals and generates an output signal corresponding to the phase difference between these two signals. The error signal includes information relating to the difference between an actual synchronously sampled data value and an ideal or target value. Other synchronously sampled data signals from read channel 18 may be provided in place of the error signal.

The output signal of read phase detector 80 is provided to read control voltage circuit 82. Read control voltage circuit 82 generates or adjusts a read control voltage in response and provides this voltage to adder circuit 92. Read control voltage circuit 82 may use a loop filter, such as an RC circuit, to maintain and provide the output signal.

During the read operation, the read control voltage is provided to adder circuit 92 along with the maintained, last write control voltage provided by write control voltage circuit 93. The last write control voltage remains constant during read operations. Adder circuit 92 calculates the sum of the two voltages and provides the resulting output voltage to VCO 94. VCO 94 receives this output voltage and adjusts the frequency of its output signal in an amount corresponding to the value of this output voltage. The output signal of VCO 94 serves as a read clock signal and is provided to read channel 18. The read clock signal is provided to read channel 18 to control the synchronous sampling of read signals. The output of VCO 94 is provided back to read phase detector 80 so that the phase difference between this signal and the error signal can be continually calculated to provide adjustments in the read clock signal throughout the read operation.

Thus, it is apparent that there has been provided, in accordance with the present invention, a phase locked loop system and method for use in a data channel of a mass storage system that satisfies the advantages set forth above. Although the present invention has been described in detail, it should be understood that various changes, substitutions, and alterations can be made herein. For example, a variety of techniques and circuitry may be used in a data channel of a mass storage system to process a data signal during both read and write operations yet the present invention may be used to provide a read clock signal and a write clock signal in any such data channels.

Also, the direct connections illustrated herein could be altered by one skilled in the art such that two devices are merely coupled to one another through an intermediate device or devices without being directly connected while still achieving the desired results demonstrated by the present invention. Other examples of changes, substitutions, and alterations are readily ascertainable by one skilled in the art and could be made without departing from the spirit and scope of the present invention. While the invention has been particularly shown and described by the foregoing detailed description, it will be understood by those skilled in the art that various other changes in form and detail may be made without departing from the spirit and scope of the invention as defined by the following claims.

What is claimed is:

1. A phase locked loop system for providing a read clock to a read channel and a write clock to a write channel, the phase locked loop system comprising:

a read phase detector operable to receive a synchronously sampled data signal from the read channel and a voltage controlled oscillator output clock signal, the read phase detector operable to generate a read control voltage in response, the read phase detector operable to provide the read control voltage during a read operation;

a write phase detector operable to receive a reference clock signal and the voltage controlled oscillator output clock signal, the write phase detector operable to generate and provide a write control voltage during a non-read operation, the write phase detector operable to maintain a last write control voltage generated during a non-read operation and to provide the last write control voltage during the read operation;

an adder circuit operable to receive the read control voltage and the write control voltage and to generate a voltage controlled oscillator input voltage in response; and a voltage controlled oscillator operable to receive the voltage controlled oscillator input voltage and to generate a voltage controlled oscillator output clock signal in response, the voltage controlled oscillator output clock signal serving as the read clock during a read operation and as the write clock during a non-read operation.

2. The phase locked loop system of claim 1, wherein the synchronously sampled data signal is a data error signal.

3. The phase locked loop system of claim 2, wherein the data error signal includes values corresponding to the difference between a sampled read signal and a target value.

4. The phase locked loop system of claim 1, further comprising:

a read control voltage circuit operable to receive the read control voltage from the read phase detector and to provide the read control voltage to the adder circuit during the read operation.

5. The phase locked loop system of claim 4, wherein the read control voltage circuit and the adder circuit are coupled during the read operation and uncoupled during the non-read operation.

6. The phase locked loop system of claim 1, further comprising:

a write control voltage circuit operable to receive the write control voltage from the write phase detector and to provide the write control voltage to the adder circuit during the non-read operation, the write control voltage circuit further operable to maintain a last write control voltage provided by the write phase detector during the non-read operation and to provide the last write control voltage to the adder circuit during the read operation.

7. The phase locked loop system of claim 6, wherein the write control voltage circuit and the write phase detector are coupled during the non-read operation and uncoupled during the read operation.

8. The phase locked loop system of claim 7, further comprising:

a divide by M circuit operable to receive the reference clock signal and to provide a frequency adjusted reference clock signal to the write phase detector; and a divide by N circuit operable to receive the voltage controlled oscillator output clock signal and to provide a frequency adjusted voltage controlled oscillator output clock signal to the write phase detector.

9. The phase locked loop system of claim 6, wherein the write control voltage circuit includes a loop filter capacitor for storing and maintaining the write control voltage.

10. The phase locked loop system of claim 1, further comprising:

a zero phase restart circuit operable to receive the reference clock signal and a read enable signal, the zero phase restart circuit operable to reset the phase of the voltage controlled oscillator output clock signal to that of the reference clock signal when a transition occurs from the read operation to the non-read operation.

11. A data channel for use in a mass storage system, the mass storage system having a data storage medium, and a control circuitry, the data channel comprising:

a write channel operable to receive and process a digital data signal provided from the control circuitry during a non-read operation, the write channel operable to provide a corresponding write signal to the data storage medium in response, the write channel controlled by a write clock signal;

a read channel operable to receive and process a read signal received from the data storage medium during a read operation, the read channel operable to provide a corresponding digital data signal to the control circuitry in response, the read channel controlled by a read clock signal; and a phase locked loop system having a read phase detector, a write phase detector, an adder circuit, and a voltage controlled oscillator, the phase locked loop system operable to generate the write clock signal and to provide the write clock signal to the write channel at an output of the voltage controlled oscillator during the non-read operation, the phase locked loop system operable to generate the read clock signal and to provide the read clock signal to the read channel at the output of the voltage controlled oscillator during the read operation.

12. The data channel of claim 11, wherein the phase locked loop system further having:

the read phase detector operable to receive a synchronously sampled data signal from the read channel and a voltage controlled oscillator output clock signal, the read phase detector operable to generate a read control voltage in response, the read phase detector operable to provide the read control voltage during a read operation;

the write phase detector operable to receive a reference clock signal and the voltage controlled oscillator output clock signal, the write phase detector operable to generate and provide a write control voltage during the non-read operation, the write phase detector operable to maintain a last write control voltage generated during the non-read operation and to provide the last write control voltage during the read operation;

the adder circuit operable to receive the read control voltage and the write control voltage and to generate a voltage controlled oscillator input voltage in response; and the voltage controlled oscillator operable to receive the voltage controlled oscillator input voltage and to generate a voltage controlled oscillator output clock signal in response, the voltage controlled oscillator output clock signal serving as the read clock signal during the read operation and as the write clock signal during the non-read operation.

13. The phase locked loop system of claim 12, further comprising:

a read control voltage circuit operable to receive the read control voltage from the read phase detector and to provide the read control voltage to the adder circuit during the read operation.

14. The data channel of claim 13, wherein the read control voltage circuit and the adder circuit of the phase locked loop system are coupled during the read operation and uncoupled during the non-read operation.

15. The data channel of claim 14, wherein the phase locked loop system includes a write control voltage circuit operable to receive the write control voltage from the write phase detector and to provide the write control voltage to the adder circuit during the non-read operation, the write control voltage circuit further operable to maintain a last write control voltage provided by the write phase detector during the non-read operation and to provide the last write control voltage to the adder circuit during the read operation.

16. The data channel of claim 15, wherein the write control voltage circuit and the write phase detector are coupled during the non-read operation and uncoupled during the read operation.

17. The data channel loop of claim 16, further comprising:
a divide by M circuit operable to receive the reference clock signal and to provide a frequency adjusted reference clock signal to the write phase detector; and
a divide by N circuit operable to receive the voltage controlled oscillator output clock signal and to provide a frequency adjusted voltage controlled oscillator output clock signal to the write phase detector.

18. A method for providing a write clock signal to a write channel during a non-read operation and a read clock signal to a read channel during a read operation, the method comprising the steps of:
receiving a reference clock signal and a synchronously sampled data signal;
generating a write control voltage during the non-read operation, the write control voltage corresponding to a phase difference between the reference clock signal and the write clock signal provided as an output of a voltage controlled oscillator during the non-read operation;
providing the write control voltage to a voltage controlled oscillator during the non-read operation;
generating a write clock signal as the output of the voltage controlled oscillator during the non-read operation;
transitioning from the non-read operation to the read operation;
maintaining the last write control voltage generated before transitioning from the non-read operation to the read operation;
generating a read control voltage during the read operation, the read control voltage corresponding to the phase difference between the synchronously sampled data signal and the read clock signal provided as the output of the voltage controlled oscillator during the read operation; providing the maintained last write control voltage and the read control voltage to the voltage controlled oscillator; and
generating a read clock signal as the output of the voltage controlled oscillator during a read operation.

19. The method of claim 18, further comprising the steps of:
dividing the reference clock signal by an integer M before the step of generating the write control voltage; and
dividing the write clock signal by an integer N before the step of generating the write control voltage.

20. The method of claim 18, further comprising the step of:
performing a zero phase restart on the read clock signal after the step of transitioning from the non-read operation to the read operation.

21. The method of claim 18, wherein the step of transitioning from the non-read operation to the read operation includes performing a zero phase restart on the read clock signal.

* * * * *